US 6,916,527 B2
Jul. 12, 2005

(12) United States Patent
Ikegawa et al.

(54) RESIN MOLDINGS

(75) Inventors: Naoto Ikegawa, Kadoma (JP);
Masahiro Sato, Kadoma (JP); Naoyuki
Kondo, Kadoma (JP)

(73) Assignee: Matsushita Electric Works, Ltd.,
Kadoma (JP)

( * ) Notice: Subject to any disclaimer, the term of this
patent is extended or adjusted under 35
U.S.C. 154(b) by 0 days.

(21) Appl. No.: 09/986,005

(22) Filed: Nov. 7, 2001

(65) Prior Publication Data
US 2002/0132108 A1 Sep. 19, 2002

(30) Foreign Application Priority Data
Jan. 18, 2001 (JP) .......................... 2001-010613
Jan. 18, 2001 (JP) .......................... 2001-010614

(51) Int. Cl.⁷ .............................. B32B 5/06; B32B 5/16;
B32B 27/06; B32B 15/08
(52) U.S. Cl. .................... 428/301.1; 428/323; 428/324;
428/325; 428/330; 428/331; 428/419; 428/458;
428/463; 428/901
(58) Field of Search ................................ 428/461, 463,
428/907, 297.4, 301.1, 323, 324, 325, 330,
331, 458, 459, 419

(56) References Cited
U.S. PATENT DOCUMENTS

| 4,337,279 A | * | 6/1982 | Polak | 427/537 |
|---|---|---|---|---|
| 4,395,512 A | * | 7/1983 | Kubota et al. | 524/413 |
| 4,654,255 A | * | 3/1987 | Kojima et al. | 442/149 |
| 4,751,146 A | * | 6/1988 | Maeda et al. | 428/475.8 |
| 4,772,496 A | * | 9/1988 | Maeda et al. | 428/35.9 |
| 4,795,671 A | * | 1/1989 | Shiiki et al. | 428/209 |
| 4,943,606 A | * | 7/1990 | Inoue et al. | 523/457 |
| 5,019,442 A | * | 5/1991 | Ogawa et al. | 428/215 |
| 5,157,070 A | * | 10/1992 | Orikasa et al. | 524/504 |
| 5,179,160 A | * | 1/1993 | Orikasa et al. | 525/66 |
| 5,206,281 A | * | 4/1993 | Furuta | 524/425 |
| 5,409,996 A | * | 4/1995 | Shinohara et al. | 525/189 |
| 5,418,275 A | * | 5/1995 | Okada et al. | 524/504 |
| 5,418,286 A | * | 5/1995 | Takahashi et al. | 525/64 |
| 5,578,679 A | * | 11/1996 | Suzuki et al. | 525/64 |
| 5,668,214 A | * | 9/1997 | Suzuki | 525/64 |
| 5,681,893 A | * | 10/1997 | Bailly et al. | 525/64 |
| 5,804,634 A | * | 9/1998 | Umetsu et al. | 524/466 |
| 6,124,004 A | * | 9/2000 | Furuta et al. | 428/1.1 |
| 6,165,309 A | * | 12/2000 | Burnell et al. | 156/308.2 |
| 6,375,863 B1 | * | 4/2002 | Tachikawa et al. | 252/299.01 |

OTHER PUBLICATIONS

U.S. Appl. No. 09/871,896, filed Jun. 4, 2001, Ikegawa et al.
U.S. Appl. No. 09/986,005, filed Nov. 7, 2001, Ikegawa et al.

* cited by examiner

Primary Examiner—Kevin R. Kruer
(74) Attorney, Agent, or Firm—Oblon, Spivak, McClelland, Maier, & Neustadt, P.C.

(57) ABSTRACT

A resin molded component, comprising metal coating treatment being provided on the surface by a physical deposition method chosen from among sputtering, vacuum deposition, and ion plating after the surface is activated by plasma treatment, and is produced by forming a resin composition combined a base resin comprising of a thermoplastic resin or a thermosetting resin with a rubber-like elastic material.

17 Claims, 4 Drawing Sheets (a)

(b)

(a)

(b)

(a)

(b)

RESIN MOLDINGS

BACKGROUND OF THE INVENTION

1. Field of the Invention

The present invention relates to a resin molded component whose surface is coated with metal by physical deposition method for practical use.

2. Description of the Related Art

Printed circuit boards such as MID, sensor parts, reflectors and the like are manufactured by fabricating a resin molded component by injection-molding a resin composition, and by coating the surface of the resin molded component with a metal layer serving as circuits and reflecting films by physical deposition method such as sputtering, vacuum evaporation, and ion plating.

The resin composition that forms the resin molded component comprises of a thermosetting resin or a thermoplastic resin, and the resin molded component generally provides a low adhesion to metal. In particular, when the metal layer is formed on the surface of the resin molded component by the physical deposition method which is a dry method such as sputtering, vacuum evaporation, and ion plating, it is still more difficult to obtain the adhesion between the resin molded component and the metal than by wet method such as electrolysis or electroless plating.

Therefore, in order to improve the adhesion of the metal layer to the resin molded component, the surface of the resin molded component is plasma-treated. This plasma treatment is carried out in the activated gas atmosphere such as oxygen, nitrogen and the like, wherein ions of such as oxygen, nitrogen and the like in the plasma act on the surface of the resin molded component to activate it by providing particles on the surface of the resin molded component with a polar group such as oxygen polar group, nitrogen polar group and the like, resulting in improving the adhesion of the metal layer to the resin molded component.

However, in the present situation it is still difficult to obtain a high effect of improving the adhesion between the resin molded component surface and the metal layer only by activating the surface by plasma treatment.

SUMMARY OF THE INVENTION

In view of the foregoing, it is an object of the present invention to provide a resin molded component, on which metal can be coated with high adhesion.

The resin molded component according a first embodiment of the present invention is a resin molded component, whose surface is coated with metal by a physical deposition method chosen from among sputtering, vacuum evaporation, and ion plating after the surface is activated by plasma treatment, and which is produced by forming a resin composition with a rubber-like elastic material compounded to the base resin comprising of a thermoplastic resin or a thermosetting resin.

The resin molded component according to a second embodiment of the present invention is characterized in that at least one kind of copolymer chosen from ethylene-glycidyl methacrylate-methyl acrylate copolymer, ethylene-maleic anhydride-ethyl acrylate copolymer, graft copolymer of ethylene-glycidyl methacrylate copolymer and acrylonitrile-styrene copolymer, and ethylene-glycidyl methacrylate-ethylene ethyl acrylate copolymer is used, in respect to the resin molded component according to the first embodiment.

The resin molded component according to a third embodiment of the present invention is characterized in that a mixing amount of the rubber-like elastic material is from 0.5 to 10 parts in mass to 100 parts in mass of the base resin, in respect to the resin molded component according to the first embodiment.

The resin molded component according to a fourth embodiment of the present invention is characterized in that polyphthalamide or polyphenylene sulfide is used as the base resin, in respect to the resin molded component according to the first embodiment.

The resin molded component according to a fifth embodiment of the present invention is characterized in that the resin composition is compounded with an inorganic filler, in respect to the resin molded component according to the first embodiment.

The resin molded component according to a sixth embodiment of the present invention is characterized in that the inorganic filler is in a fiber form of 0.5 to 5 $\mu$m in diameter and 10 to 50 $\mu$m in length, in respect to the resin molded component according to the fifth embodiment.

The resin molded component according to a seventh embodiment of the present invention is characterized in that the inorganic filler is in a form of plate, in respect to the resin molded component according to the fifth embodiment.

The resin molded component according to an eighth embodiment of the present invention is characterized in that the inorganic filler in a fiber form of 0.5 to 5 $\mu$m in diameter and 10 to 50 $\mu$m in length and the plate-form inorganic filler are used together, in respect to the resin molded component according to the fifth embodiment.

The resin molded component according to a ninth embodiment of the present invention is characterized in that the inorganic filler is spherical, in respect to the resin molded component according to the fifth embodiment.

The resin molded component according to a tenth embodiment of the present invention is characterized in that a mixing amount of the inorganic filler is from 40 to 75% in mass to the whole resin composition, in respect to the resin molded component according to the fifth embodiment.

The resin molded component according to an eleventh embodiment of the present invention is characterized in that the resin molded component is used as a printed circuit board, in respect to the resin molded component according to the first embodiment.

DESCRIPTION OF THE PREFERRED EMBODIMENTS

Figure 1:
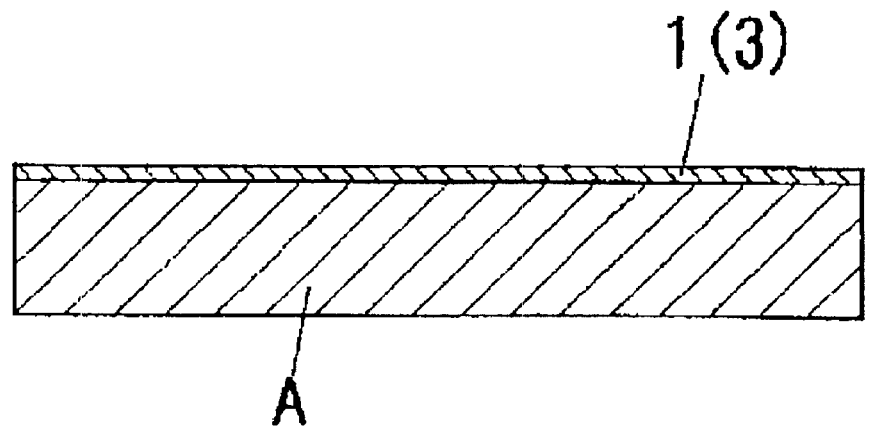
FIG. 1 shows an example of the form of the resin molded component according to the present invention, and (a) shows a cross-sectional view of one example whose circuit forming surface is a plane, and (b) shows a cross-sectional view of one example whose circuit forming surface is a three-dimensional shape.
Figure 1:
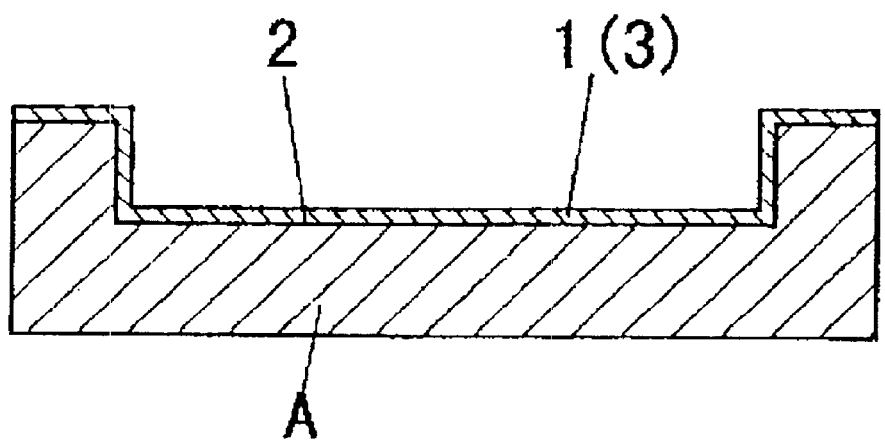

Preferred embodiments of the present invention will be described in detail as follows.

The resin molded component according to the present invention is produced by forming a resin composition compounded a rubber-like elastic material with the base resin comprising of a thermoplastic resin or a thermosetting resin. The thermoplastic resin or the thermosetting resin used as the base resin is not particularly limited, but the thermoplastic resin or the thermosetting resin containing at least any of amide bonds, sulfide group, or cyano group is particularly preferable, and also, the thermoplastic resin or the thermosetting resin containing at least any of sulfone group, ketone group, imide group, epoxy group, or mercaptan group is preferable. Examples of the thermoplastic resin or the thermosetting resin containing amide bonds include 6 nylon (PA6), 6—6 nylon (PA66), PA-MXD-6, aromatic polyamide (polyphthalamide: PA6T, PA9T) and the like, examples of those containing sulfide group include polyphenylene sulfide resin (PPS) and the like, and examples of those containing cyano group include polyether nitrile (PEN), ABS and the like. Also, examples of those containing sulfone group include polysulfone (PSF), polyether sulfone (PES) and the like, examples of those containing ketone group include polyketone (PK), polyetherether ketone (PEEK) and the like, and examples of those containing imide group include polyetherimide (PEI), polyimide (PI) and the like. Examples of thermosetting resin include epoxy resin, unsaturated polyester resin, vinyl ester resin, polyimide resin, phenol resin, urea resin and the like. Of these, from the viewpoints of their original metal layer adhesion and metal improved layer adhesion effects by a rubber-like elastic material later discussed, and further of heat resistance, mechanical properties, and chemical resistance, it is particularly preferable to use polyphthalamide or polyphenylene sulfide. Furthermore, the polyphenylene sulfide (PPS) is a thermoplastic resin having the phenyl group as a repeating unit, and is commonly known as the resin having excellent thermal resistance, rigidity and the like. And the PPS resin is generally classified into a bridging type, a semi-bridging type (semi-normal chain type), a normal chain type, and the normal chain type PPS resin is preferably used in the present invention since it provide superb adhesion to metal as well as excellent mechanical strength.

In the resin molded component described above, as a rubber-like elastic material, rubber, thermoplastic elastomer and the like having lower elastic modulus than that of the base resin are used, and further, a reforming agent for improving impact resistance, fluidity, slidability, and compatibility of polymer alloy may be used. The reforming agent is preferably a reactive one. Examples of such rubber-like elastic material include such reforming agent as low-density polyethylene, polypropylene, ethylene-glycidylmethacrylate copolymer (EGMA), ethylene-glycidylmethacrylate-vinyl acetate copolymer, ethylene-glycidylmethacrylate-methyl acrylate copolymer, ethylene-ethyl acrylate copolymer (EEA), ethylene-vinyl acetate copolymer (EVA), ethylene-maleic anhydride-ethylacrylate copolymer (E/MAH/EA), ethylene-glycidylmethacrylate-ethylene ethyl acrylate copolymer (E/GMA/EEA), styrene, styrene-acrylonitril, methyl methacrylate (MMA), silicone, vinyl acrylate (VA), methyl acrylate (MA), and a graft copolymer or a block copolymer between any one of these copolymers and polystyrene, or polymethyl methacrylate, or acrylonitryl-styrene copolymer (AS) and the like. In addition, core-shell type particulate elastic material such as siloxane containing core shell rubber including natural rubber, polybutadiene, polyisoprene, polyisobutyrene, neoprene, polysulfide rubber, thiocol rubber, acryl rubber, urethane rubber, silicone rubber, epichlorohydrin rubber, styrene-butadiene block copolymer (SBR), hydrogenated styrene-butadiene block copolymer (SEB), styrene-butadiene-styrene block copolymer (SBS), hydrogenated styrene-butadiene-styrene block copolymer (SEBS), styrene-isoprene block copolymer (SIR), hydrogenated styrene-isoprene block copolymer (SEP), styrene-isoprene-styrene block copolymer (SIS), hydrogenated styrene-isoprene styrene block copolymer (SEPS), ethylene propylene rubber (EPR), ethylene propylene diene rubber (EPDM), butadiene-acrylonitrile-styrene-core shell rubber (ABS), methyl methacrylate-butadiene-styrene-core shell rubber (MBS), metyl methacrylate-butyl acrylate-styrene-core shell rubber (MAS), octyl acrylate-butadiene-styrene-core shell rubber (MABS), alkyl acrylate-butadiene-acrylonitrile-styrene core shell rubber (AABS), butadiene-styrene-core shell rubber (SBR), methyl methacrylate-butyl acrylate-siloxane, or those modified with maleic anhydride or glycidyl methacrylate, epoxy and the like are proposed.

In the resin molded component, it is particularly preferable to use at least one kind of copolymer chosen from among ethylene-glycidyl methacrylate-methyl acrylate copolymer, ethylene-maleic anhydride-ethyl acrylate copolymer, a graft copolymer of ethylene-glycidyl methacrylate copolymer and acrylonitrile-styrene copolymer, and ethylene-glycidyl methacrylate-ethylene ethyl acrylate copolymer described above. Because these copolymers have reactive functional groups, they are easily activated by plasma treatment later discussed, and the adhesion of metal layer to the resin molded component can be further improved.

A mixing amount of rubber-like elastic material to the base resin varies depending on the kind of the base resin the kind of the rubber-like elastic material and the like, but is preferable from 0.5 to 10 parts in mass to 100 parts in mass of the base resin, and more preferably, from 1 to 5 parts in mass. When the mixing amount of the rubber-like elastic material is less than 0.5 parts in mass, the effects of improving the adhesion of the metal to the surface of the resin molded component may not be sufficiently obtained, and conversely, when it exceeds 10 parts in mass, the coefficient of linear expansion of the formed resin molded component may increase and at the same time, lower heat resistance.

Since the resin molded component according to the present invention contains a rubber-like elastic material with high energy absorption, the flexibility of the resin molded component increases more than that of the resin molded component formed by the base resin only, resulting in improving the energy absorption. By this, even when external force exfoliating the metal layer such as plating stress or thermal stress caused by difference of linear expansion coefficient between the surface of the resin molded component and the metal layer provided on the surface is exerted, the stress by the external force is mitigated and therefore, the adhesion of the metal layer to the resin molded component surface can be improved. In particular, when the rubber-like elastic material with large reforming effects by plasma treatment is used, the adhesion of the metal layer to the resin molded component can be further improved. In addition, since the energy absorption of the resin molded component is enhanced by allowing to contain the rubber-like elastic material, the impact resistance of the resin molded component is improved and chipping and cracking in the resin molded component can be prevented and at the same time, chipping and cracking of the resin molded component and peeling-off of mold burr can be reduced. Consequently, when the resin molded component is applied to, for example, a printed circuit board, the generation and contamination of foreign matter in the printed circuit board arising from these can be eliminated and the bump bondability and the like can be stabilized.

It is possible to prepare the resin molded component by mixing the rubber-like elastic material with the base resin, and it is also preferable to mix the powdery, spherical, fibrous, plate-form or other inorganic fillers with the resin composition.

As an amorphous powdery inorganic filler, zinc oxide, magnesium oxide, iron oxide, titanium oxide, aluminum borate, alumina, silica, calcium carbonate, calcium silicate, talc, mica, kaolin, graphite powder, carbon black, glass powder and the like can be used. As a spherical inorganic filler, spherical silica, glass bead, glass balloon, spherical alumina, spherical aluminum silicate and the like can be used. Furthermore, as a fibrous inorganic filler, glass fiber, carbon fiber, whiskers of silicon carbide, silicon nitride, zinc oxide, alumina, calcium titanate, potassium titanate, barium titanate, aluminum borate, aluminum silicate, calcium silicate, magnesium borate, calcium carbonate, magnesium oxysulfate fibers and the like, and wallastonite and the like can be used. As a plate-form inorganic fillers, talc, mica, glass flake, monmorillonite, smectite and the like can be used.

For the above-mentioned inorganic fillers, a fibrous inorganic filler of 0.5 to 5 $\mu$m in diameter and 10 to 50 $\mu$m in length or a plate-form inorganic filler, or both, or a spherical inorganic filler is preferably used.

Of the fibrous inorganic fillers, the use of a fibrous inorganic filler of in particular 0.5 to 5 $\mu$m in diameter and 10 to 50 $\mu$m in length as the inorganic filler can relax the anisotropy caused by the orientation of the filler both in the flow direction of the resin composition and in its transverse direction when the resin composition is formed by injection molding and the like compared to the case of using a fibrous filler with a comparatively long fiber length such as glass fiber, and can further reduce the difference between the coefficient of linear expansion or molding shrinkage ratio in the flow direction of the resin composition of resin molded component and in its transverse direction. Consequently, it is possible to reduce molding warpage arising from the anisotropy of the molding shrinkage ratio and deformation during heating (thermal deformation) arising from the anisotropy of linear expansion coefficient, and particularly, warpage deformation in the out-of-plane direction (out-of-plane deformation). Therefore, the use of the fibrous inorganic filler can provide an excellent flatness at the time of molding (initial flatness) to reduce the change of flatness at the time of heating. For example, when flip-chip mounting is carried out, the molding warpage impairs the flatness, and it becomes difficult to secure the bump bondability at the time of mounting (initial bondability), and the thermal deformation causes to degrade not only the initial bondability, but also the bump bond reliability. Consequently, it is possible to improve and stabilize the bump bondability by using a fibrous inorganic filler of 0.5 to 5 $\mu$m in diameter and 10 to 50 $\mu$m in length. Furthermore, a large stress caused at the interface between the resin molded component and the metal layer formed on the surface depending on the resin molded component being thermally deformed can be eliminated preventing the adhesion of the circuit formed by this metal layer from being degraded not to reduce the conductive reliability of the circuit.

By the use of the plate-form inorganic filler as inorganic filler, the anisotropy of physical properties caused by the filler being oriented in the flow direction of the resin composition and in its transverse direction when the resin composition is formed by injection molding and the like is further reduced compared to the case of the above-described fibrous inorganic filler being used, and the difference between the linear expansion coefficient and the molding shrinkage ratio in the flow direction of the resin composition of the resin molded component and in its transverse direction is further decreased. Furthermore, the absolute value of linear expansion coefficient can be reduced. Consequently, it is possible to reduce the generation of molding warpage arising from the anisotropy of the molding shrinkage ratio or the deformation at the time of heating (thermal deformation) arising from the anisotropy of the linear expansion coefficient, that is, the generation of the warpage deformation in the out-of-plane direction (out-of-plane deformation) and the deformation in the plane direction (in-plane deformation). Consequently, the use of the plate-form inorganic filler achieves the outstanding flatness at the time of molding (initial flatness) and not only the change of flatness by heating can be reduced, but also the thermal deformation rate in the in-plane direction can be reduced. For example, in the case of flip-chip mounting, it is difficult to secure the bump bondability at the time of the mounting (initial bondability) because the molding warpage impairs the flatness, and the thermal deformation causes the degradation not only of the initial bondability but also of the bump bond reliability. Consequently, evenly compared with the case when the above-described fibrous filler is used, the use of the plate-form inorganic filler can further improve and stabilize the bump bondability. Furthermore, a large stress at the interface between the resin molded component and the metal layer formed on the surface depending on the resin molded component being thermally deformed can be eliminated preventing the adhesion of the circuit formed by this metal layer from being degraded not to reduce the conductive reliability of the circuit.

In the present invention, the plate-form inorganic filler indicate a filler whose average length is from 1 to 80 $\mu$m, and preferably, from 1 to 50 $\mu$m, and whose average aspect ratio (length/thickness) is from 2 to 60, and preferably, from 10 to 40. When the average length is less than 1 $\mu$m, since the reinforcement effects and deformation resistivity achieved by the addition of the plate-form inorganic filler are small, the dimensional change due to heat become large, while the average length becomes more than 80 $\mu$m, since the crude density condition is generated, the adhesion distribution occurs microscopically. When the average aspect ratio is less than 2, the crude density condition is generated, and the adhesion distribution occurs microscopically, and in addition, since the reinforcement effects and the deformation resistivity by adding the plate-form inorganic filler are small, the dimensional change by heat because large, and when the average aspect ratio becomes more than 60, the deformation resistively decreases and the dimensional change by heat becomes large since the rigidity of the inorganic filler decreases and the resultant reinforcement effects decrease.

Furthermore, by the combined use of the fibrous inorganic filler of 0.5 to 5 $\mu$m in diameter and 10 to 50 $\mu$m in length and the plate-form inorganic filler as an inorganic filler, the anisotropy caused by orientation of the filler in the flow direction of the resin composition and in the transverse direction and in the direction perpendicular to them (thickness direction) further decreases when the resin composition is formed by injection molding and the like, compared to the case of using the fibrous inorganic filler and the plate-form inorganic filler individually, and the difference between the linear expansion coefficient and the molding shrinkage ratio in the flow direction and in its transverse direction, and in the thickness direction further decreases. Furthermore, it can be made smaller than the absolute value of the linear expansion coefficient. Consequently, the molding warpage arising from anisotropy of the molding shrinkage ratio and the deformation during heating (thermal deformation) arising from anisotropy of the linear expansion coefficient, that is, the generation of warpage deformation in the out-of-place direction (out-of-plane deformation) and the deformation in the plane direction (in-plane deformation) can be further reduced. Therefore, since the molding shrinkage ratio and the linear expansion coefficient can be kept small irrespective of the flow direction of the resin composition and also the anisotropy can be suppressed to a small level, when a fibrous inorganic filler of 0.5 to 5 $\mu$m in diameter and 10 to 50 $\mu$m in length and a plate-form inorganic filler are used together, the resin molded component achieves an outstanding flatness at the time of molding (initial flatness) in all the surfaces and also the change in flatness caused by heating can be kept small as well as the thermal deformation rate in the in-plane direction can be reduced, and provides an excellent applicability to a complicated three-dimensional figure. In addition, the resin molded component not only has effects on the flip-chip mounting, but also achieves superb mounting of a chip made of a single crystal inorganic material such as LED and the like. Furthermore, a large stress is no longer generated at the interface between the resin molded component and the metal layer formed on the surface, depending on the thermal deformation of the resin molded component, and the adhesion strength of the circuit formed by this metal layer can be prevented from lowering, and thereby the circuit conductive reliability can be prevented from decreasing.

Using the spherical inorganic filler as an inorganic filler can eliminate the orientation of the filler in the flow direction of the resin composition when the resin composition is formed by injection molding and the like. Consequently, the resin molded component becomes free of anisotropy caused by the orientation of the filler, and the linear expansion coefficient and the molding shrinkage ratio in the flow direction of the resin composition, in its transverse direction, and in the direction perpendicular to them (thickness direction) can be almost equalized. For this reason, the molding warpage arising from anisotropy of the molding shrinkage ratio and the deformation at the time of heating (thermal deformation) arising from anisotropy of the linear expansion coefficient can be prevented from being generated. Therefore, the bump bondability in the flip-chip mounting can be improved and stabilized. In addition, since only the spherical surface of the spherical filler is exposed on the surface of the resin molded component, a high surface smoothness is obtained. By this, when a circuit is formed on the surface of the resin molded component, the fine lines can be precisely and easily formed on the circuit, and a circuit with a precise and fine line of for example, 0.03 mm in circuit pattern width (line width) and 0.03 mm in width between circuit patterns (space width) can be formed. Further, a large stress at the interface between the resin molded component and the metal layer formed on the surface, depending on the thermal deformation of the resin molded component, is no longer generated and the adhesion strength of the circuit formed by this metal layer can be prevented from lowering, and thereby the circuit conductive reliability can be prevented from lowering.

In the present invention, the spherical inorganic filler indicate that of 0.1 to 20 $\mu$m in average diameter. When the average diameter is less than 0.1 $\mu$m, coagulation lumps tend to be formed on the surface due to faulty dispersion when the resin composition is pelletized using an extruding machine before forming the resin molded component and it becomes difficult to be formed, or the molded component is embrittled so that it is unable to be used for printed circuit board. When the average diameter becomes more than 20 $\mu$m, the filler exceeds over the limit mixing amount at a low level of inorganic filler mixing rate, and it becomes difficult to successfully distribute the filler in the resin molded component, in particular, in the surface layer, and thus, tends to become difficult to improve the strength of the resin molded component to reduce the molding shrinkage ratio and the linear expansion coefficient and at the same time, to suppress the anisotropy to a small level.

By mixing the inorganic filler, the dimensional stability of the resin molded component can be improved and the generation of the thermal deformation and the like can be suppressed, and in addition, since the linear expansion coefficient of the resin molded component can be reduced, it is possible to reduce the generation of stress at the interface between the resin molded component and the metal layer covered on the surface can be reduced at the time of heating, thus, and the adhesion of the metal layer to the resin molded component can be suppressed from lowering. The mixing amount of the inorganic filler is preferably from 40 to 75% in mass of the total amount of the resin composition, but since the mixing amount depends on the viscosity of the base resin at the time of kneading of the resin composition and the mixing rate of the inorganic filler can be increased for a resin with lower viscosity, the mixing amount can be suitably set in accordance with the kind of base resin. Specifically, in the case of PPS whose viscosity at the time of processing is comparatively low, the range of 60 to 75% in mass in the total amount of the resin composition is particularly preferable, and in the case of PPA, the range of 40 to 65% in mass is particularly preferable. If the mixing amount of the inorganic filler is less than 40% in mass, the effects of increasing the dimensional stability of the resin molded component cannot be sufficiently obtained and conversely, if the mixing amount of the inorganic filler exceeds 75% in mass, the adhesion of the metal layer to the resin molded component is degraded and the exfoliation is likely to occur. Consequently, by maintaining the mixing amount of the inorganic filler within this range, the dimensional stability of the resin molded component can be improved while securing the adhesion of the metal layer to the resin molded components. In addition, when two or more kinds of inorganic fillers are used, the mixing ratio is not particularly limited.

In the present invention, when the base resin of the resin composition is a crystalline thermoplastic resin, powdery, fibrous, plate-form, spherical, and other fine fillers may be mixing in traces in such a range that will not impair the action of the present invention.

In addition, in the present invention, additives such as plasticizer, antistatic agent, stabilizer, coloring agent such as pigment and the like, smoother, and flame retardant may be mixed in traces in such a range that will not impair the action of the present invention.

By adding the rubber-like elastic material and the inorganic filler, if necessary to the base resin and mixing and kneading these materials, the resin composition can be prepared, and by forming the composition by injection molding and the like using molds after the resin composition is formed into pellets by extruder and the like, the above-mentioned resin molded component can be obtained.

The resin molded component according to the present invention particularly provides the excellent adhesion of the circuit when the circuit forming surface is three-dimensional shape. In particular, because the generation of deformation is reduced when a fibrous inorganic filler of 0.5 to 5 μm in diameter and 10 to 50 μm in length, a plate-form inorganic filler, and a spherical inorganic filler are used as the inorganic filler, it is suitable for flip-chip mounting, wire-bonding mounting, and a mounting chip made of a single crystalline inorganic material. In particular, because the molding shrinkage ratio and its anisotropy can be maintained small when the fibrous inorganic filler and the plate-form inorganic filler are used as the inorganic filler, not only the resin molded component provides a superb shape accuracy in terms of warpage and the like right after molding, but also the thermal deformation caused by heating can be suppressed because the linear expansion coefficient and its anisotropy can be held small, allowing it to be suitable for flip-chip mounting. The resin molded component is particularly suitable for mounting a chip made of a single crystal inorganic material, wherein the small linear expansion is essential. In addition, when the spherical inorganic filler is used as the inorganic filler, the surface is smooth and it is suited for wire-bonding. The examples are shown as follows.

In FIG. 1(a), a resin molded component A having the above configuration is formed into a flat plate and on the surface, a metal layer 1 is provided to form a circuit 3. In addition, in FIG. 1(b), by forming a circuit forming surface 2 on the surface of the resin molded component A having the above configuration into a three-dimensional shape and by providing the metal layer 1 along the circuit forming surface 2, the circuit 3 formed from the metal layer 1 can be used as an MID three-dimensionally arranged. If there is any anisotropy in the linear expansion coefficient or the molding shrinkage ratio of the resin molded component, a large deformation is likely to be generated on the circuit forming surface 2 formed in the three-dimensional shape, but since there is little anisotropy in the resin molded component A, the deformation of the circuit forming surface 2 is small, and thus, it is possible to prevent the adhesion of the metal layer 1 (circuit 3) disposed on the circuit forming surface 2 from degrading and to secure high adhesion.

Figure 2:
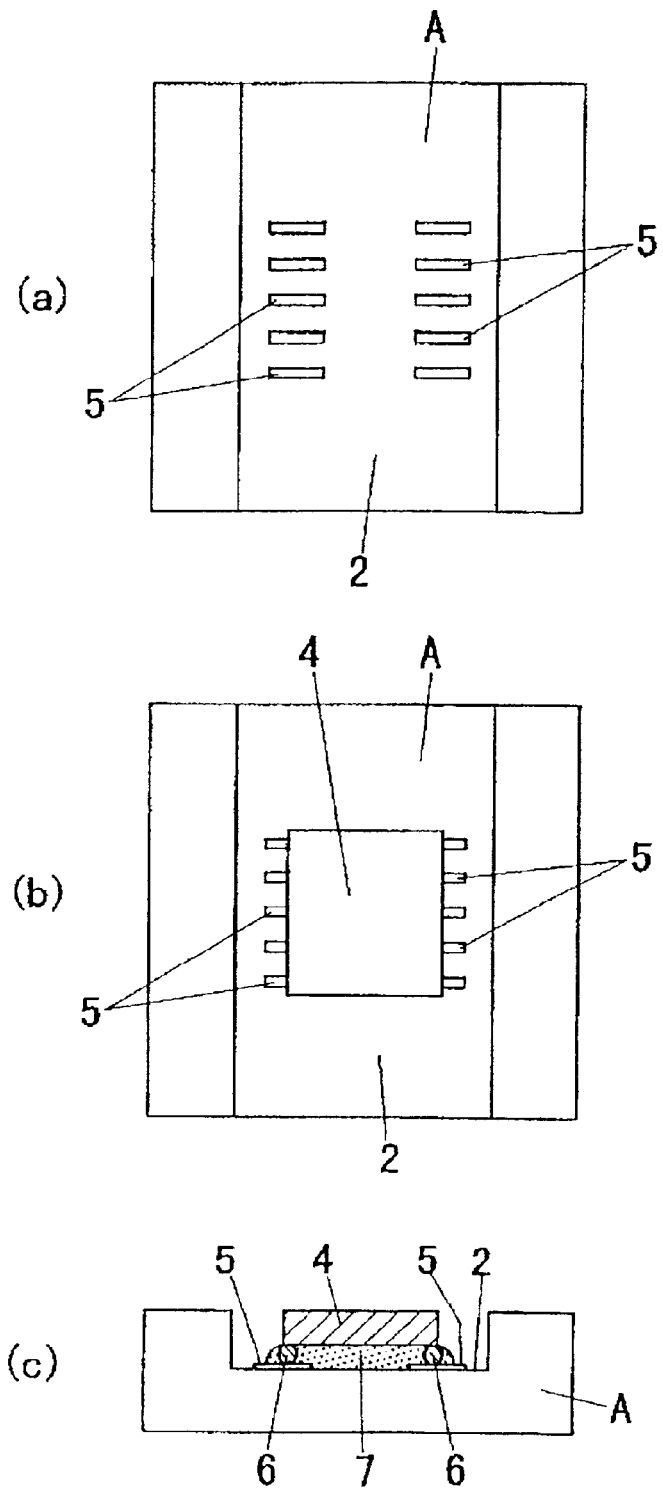
FIG. 2 shows an example of flip-chip mounting on the resin molded component according to the present invention used as a board mounting chips and (a) is a plan view showing that a circuit prior to mounting is formed, (b) is a plan view showing that a chip is flip-chip-mounted, and (c) is a front view showing that the chip is flip-chip mounted.

FIG. 2 shows an example of flip-chip mounting where the resin molded component A can be used as a circuit board to which a chip 4 such as a semiconductor chip and the like is mounted. On the circuit forming surface 2 of the resin molded component A, a bump land 5 is formed by the circuit 3 as shown in FIG. 2(a), and for the electrode of a chip 4, a bump 6 such as by gold bump, solder bump and the like is formed. And by bonding the bump 6 to the bump land 5 and filling a sealing resin 7 such as epoxy resin and the like between the chip 4 and the resin molded component A, the chip 4 is flip-chip-mounted to the resin molded component A as shown in FIGS. 2(b), (c).

Now, since the resin molded component A has little anisotropy of the linear expansion coefficient or the molding shrinkage ratio, the deformation is not generated on the surface while the molding shrinkage takes place, and thus, the superb flatness of the surface is achieved and at the same time, the thermal deformation can be suppressed even when heat is exerted at the time of mounting, and thus, the degradation of the surface flatness can be maintained to the minimum. Consequently, when the chip 4 is flip-chip-mounted to the surface of the resin molded component A as shown above, the bump bonding can be stably carried out, and not only a high initial quality of bonding but also a high long-term reliability can be obtained, leading to not increasing the connection resistance value. In addition, since the resin molded component A provides a small thermal deformation, the chip 4 mounted on the surface of the resin molded component A will not be deformed as the resin molded component A deforms, and the generation of noise from the chip 4 can be prevented from occurring.

Figure 3:
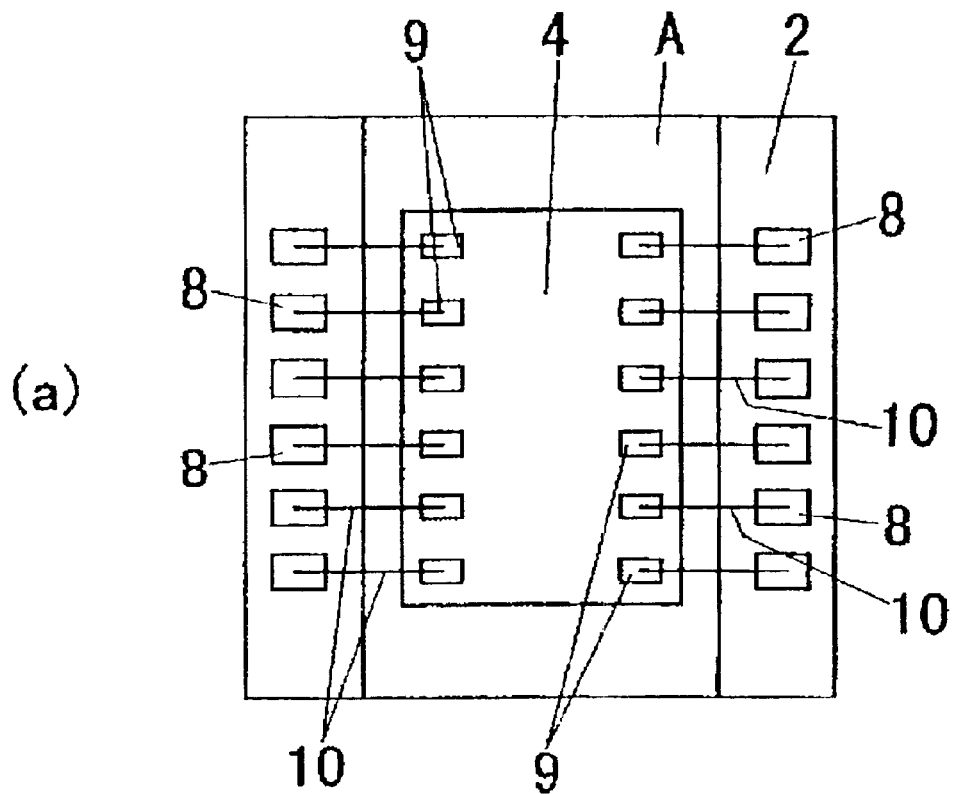
FIG. 3 shows an example of wire-bonding mounting on the resin molded component according to the present invention used as the board mounting the chip, and (a) is a plan view showing that the chip is wire-bonded, and (b) is a front view showing that the chip is wire-bonded.
Figure 3:
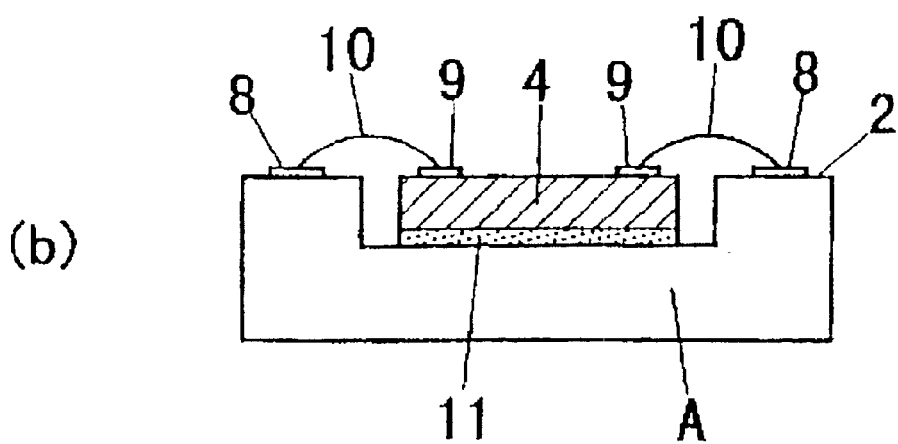

FIG. 3 shows an example of wire-bonding mounting where the resin molded component A is used as a circuit board to mount the chip 4 such as a semiconductor chips and the like. On the circuit forming surface 2 of the resin molded component A, a bonding pad 8 is formed by the circuit 3, and by bonding the chip 4 to the resin molded component A with a paste resin 11 and the like and at the same time, by wire-bonding a wire 10 such as gold wire and the like between an electrode 9 of the chip 4 and a bonding pad 8, the chip 4 is wire-bonded to the resin molded component A as shown in FIGS. 3(a), (b).

Now, since the resin molded component A provides an excellent surface smoothness, the surface of the bonding pad 8 formed on the resin molded component A also provides an excellent smoothness, and the a higher bonding capability and bonding reliability of wire 10 can be obtained.

Figure 4:
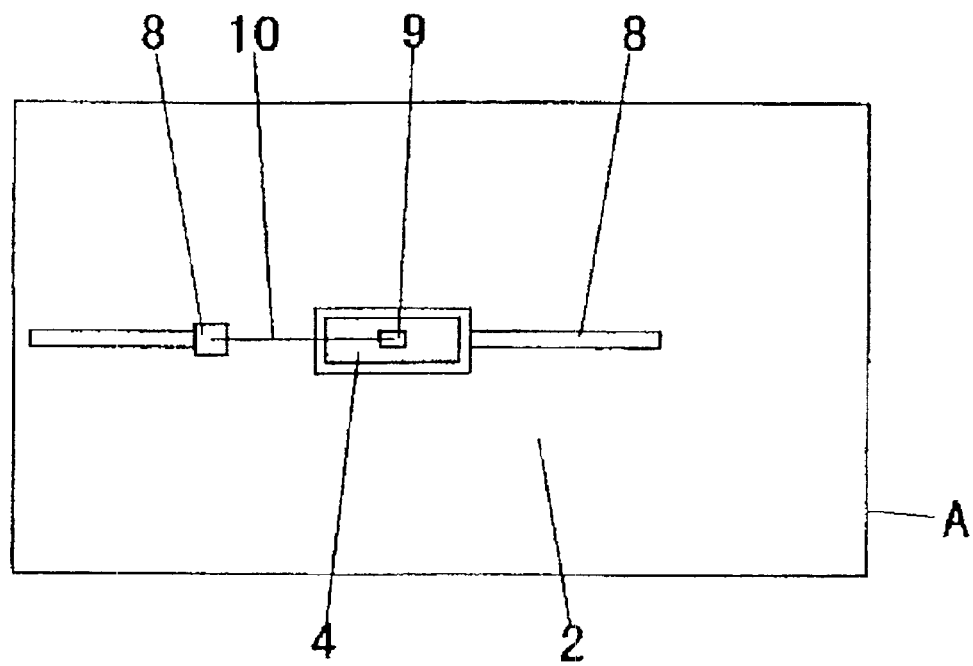
FIG. 4 shows an example showing that a chip formed with single-crystal inorganic material is mounted on the resin molded component according to the present invention, and (a) is a plan view showing that the chip is wire-bonded, and (b) is a front view showing that the chip is wire-bonded.
Figure 4:
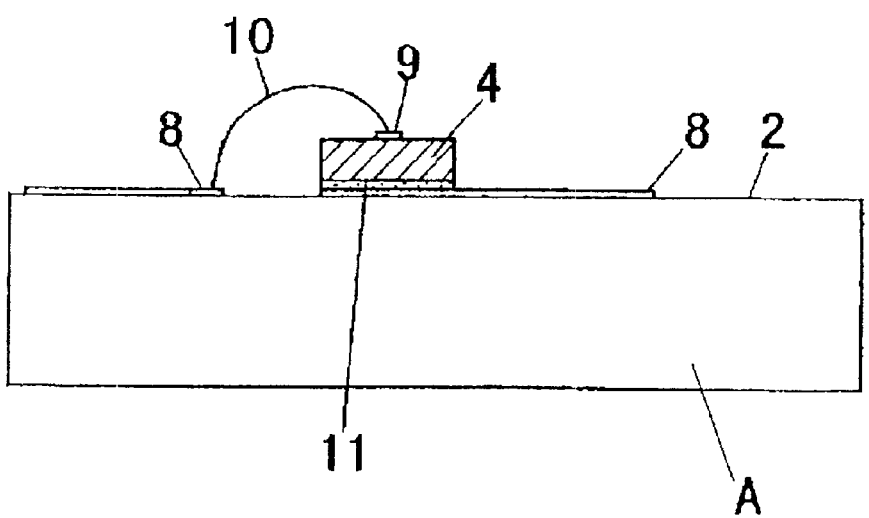

FIG. 4 shows an example of mounting a fragile chip 4 such as LED and the like formed of a single crystal inorganic material, such as GaAs (gallium arsenide), ZnSe (zinc selenide) and the like which is extremely fragile. As the mounting form, either flip-chip-mounting or wire-bonding may be acceptable. In FIG. 4, the chip 4 is bonded to the resin molded component A with a paste resin 11 and at the same time, the wire 10 such as gold wire is wire-bonded between an electrode 9 of the chip 4 and the bonding pad 8 of the resin molded component A. In such an event, if the resin molded component A is greatly thermally-deformed, stress is exerted on the fragile chip 4 being mounted and the fragile chip 4 may be damaged, but since the resin molded component A provides less anisotropy in the linear expansion coefficient, little thermal deformation occurs and the damage of fragile chip 4 can be prevented from occurring.

When the surface of the resin molded component according to the present invention is coated with metal, firstly, the surface of the resin molded component is plasma-treated to activate it. The plasma treatment can be carried out by a plasma treatment apparatus prepared by arranging a pair of electrodes opposite to each other in a chamber, connecting the high-frequency power supply to one electrode, and grounding the other electrode. In plasma-treating the surface of the resin molded component, the resin molded component is set on one electrode between electrodes and after reducing pressure to about $10^{-4}$ Pa by evacuating the chamber inside, an active gas in chemical reactions such $N_2$, $O_2$ and the like, is introduced and circulated, and at the same time, the gas pressure inside the chamber is controlled to 8 to 15 Pa, and then, high-frequency voltage (RF: 13.56 MHz) is applied to the electrodes by high-frequency power supply for about 10 to 100 seconds. In such an event, by the gas discharge phenomenon by high-frequency glow discharge between electrodes, the active gas in the chamber is excited, plasma such as cations, radicals and the like, are generated, and cations, radicals and the like, are formed in the chamber. By allowing these cations and radicals to collide against the surface of the resin molded component, the surface of the resin molded component can be activated, and the adhesion of the metal layer formed on the resin molded component can be increased. In particular, when the cations are attracted and brought to collide against the resin molded component, a nitrogen polar group or an oxygen polar group which is easy to bond metal is introduced into the surface of the resin molded component, and the adhesion to the metal layer can be further improved. In addition, the plasma treatment conditions are not limited to the foregoing, but plasma treatment can be carried out by setting optionally in such a range that the resin molded component surface is not excessively coarsened by plasma treatment.

After the plasma-treating is provided as described above, by physical vapor deposition method (PVD method) chosen from among sputtering, vacuum evaporation, and ion plating, the metal layer is formed on the surface of the resin molded component. Now, it is recommended that sputtering, vacuum evaporation, or ion plating without exposing the chamber inside to atmosphere after plasma-treating the resin molded component in the chamber as described above should be carried out continuously. Examples of metal to form the metal layer include copper, nickel, gold, aluminum, titanium, molybdenum, chromium, tungsten, tin, lead, brass, NiCr and other single substance or alloys.

Here, for sputtering, for example, the DC sputtering system may be applied. First, after placing the resin molded component in the chamber, the chamber inside is evacuated until the pressure becomes $10^{-4}$ Pa or lower by a vacuum pump, and under this condition, an inert gas such as argon and the like is introduced into the chamber until 0.1 Pa gas pressure is obtained. Further, by applying 500V DC voltage, the copper target is bombarded to form a metal layer of copper and the like with a film thickness of about 300 to 500 nm on the surface of the resin molded component.

For vacuum evaporation, for example, the vacuum evaporation system of electron beam heating-type may be applied. First, after evacuating the chamber inside until the pressure becomes $10^{-3}$ Pa or lower by a vacuum pump, by generating 400 to 800 mA electron beam stream, and bringing this electron beam stream to collide against and heat a material to be deposited in a crucible, the material is evaporated to form a metal layer such as copper and the like, with a film of about 300 nm thickness on the surface of the resin molded component.

In forming the metal layer by ion plating, for example, the chamber inside is evacuated until the pressure becomes $10^{-4}$ Pa or lower, the material to be deposited is evaporated under the above-mentioned vacuum evaporation conditions, at the same time, an inert gas such as argon and the like is introduced to the induction antenna located between the resin molded component and the crucible, the gas pressure is kept to 0.05 to 0.1 Pa to generate plasma, 500W power voltage is applied to the induction antenna at a high frequency of 13.56 MHz, at the same time the bias voltage of 100 to 500V DC voltage is applied, and thereby a metal layer such as copper and the like with a film thickness of about 300 to 500 nm can be formed on the surface of the resin molded component.

In forming the metal layer on the surface of the resin molded component by the physical deposition method as described above, the surface of the resin molded component is chemically activated by plasma treatment and the adhesion of the metal layer to the surface of the resin molded component can be improved. In forming the metal layer on the surface of the resin molded component by the physical deposition method, it is difficult to obtain the adhesion to the extent that enables the circuit to be formed by the metal layer without plasma treatment, but by activating the surface by plasma treatment, the adhesion sufficient to form the circuit can be obtained.

After forming the metal layer on the surface of the resin molded component as described above, by forming the circuit with the metal layer, the resin molded component can be used as a printed circuit board such as MID and the like. The circuit can be formed by, for example, the laser method. That is, by irradiating with laser beam along the boundary between the circuit forming section and the circuit non-forming section, and by removing the metal layer at the boundary section, the metal layer of the circuit forming section is left as the circuit patterns, and the metal layer of this circuit pattern is electrolytically plated. Then, the metal layer is soft-etched to remove the metal layer remaining at the circuit non-forming section while the circuit forming section soft-etched is allowed to remain, thereby enabling the resin molded component to be finished into a circuit board formed with the circuit of a desired pattern shape. On the surface of this circuit, a conductive layer may be further formed by nickel plating, gold plating and the like. Needless to say, the resin molded component according to the present invention can be used to any applications using with the metal layer formed on the surface such as sensor parts, reflectors and the like.

EXAMPLES

Now, the present invention will be specifically described in detail in accordance with examples.

[Base Resin]
PPA: Polyphthalamide ("N1000" commercially available from Kuraray Co., Ltd.)
PPS: Normal chain type polyphenylene sulfide ("M2888" commercially available from Toray Industries, Inc.)
PET: Polyethylene terephthalate ("KURAPET 1030" commercially available from Kuraray)
PBT: Polybutyrene terephthalate ("Hauser R1030" commercially available from Kuraray)
[Rubber-Like Elastic Material]
A: Ethylene-glycidyl methacrylate-methyl acrylate copolymer (E/GMA/MA) "BONDFAST 7L" commercially available from Sumitomo Chemical.
B: Ethylene-maleic anhydride-ethyl acrylate copolymer (E/MAH/EA) "BONDYNE AX8390" commercially available from Sumitomo Chemical.
C: Graft copolymer of ethylene-glycidyl methacrylate copolymer (E/GMA) and acrylonitrile-styrene copolymer (AS) "MODIPER A4400" commercially available from NOF Corp.
D: Ethylene-glycidyl methacrylate-ethylene ethyl acrylate copolymer (E/GMA/EEA) "REXPEARL RA3150" commercially available from NIPPON PETROCHEMICALS CO., LTD.

Example 1

Using PPA as the base resin, 3 parts in mass of the above-described A as rubber-like elastic material were mixed with to 100 parts in mass of the base resin. This was melted and kneaded at a screw rotating speed of 150 rpm in a twin-screw vent system with 25 mm in diameter and L/D=25, and after cooling a strand obtained, the strand was pelletized to prepare a resin composition. Then, this resin composition was injection-molded to form the resin molded component.

The surface of this resin molded component was plasma-treated, and the metal layer was formed by sputtering. That is, the resin molded component was firstly set into the chamber of a plasma treatment apparatus, the chamber inside was evacuated to reduce the pressure to about $10^{-4}$ Pa, then $N_2$ was introduced and circulated in the chamber as an active gas, the gas pressure inside the chamber was controlled at 10 Pa, and then, 300W power high-frequency voltage (RF: 13.56 MHz) was applied to the electrodes for 30 seconds to carry out plasma treatment.

Then, the chamber was evacuated until the inside pressure became $10^{-4}$ Pa or lower. Under this condition, argon gas was introduced into the chamber so that 0.1⁻Pa gas pressure is achieved; then, by applying 500V DC voltage, the copper target was bombarded and a copper metal layer of 400 nm in film thickness was formed on the surface of the resin molded component. After forming the metal layer in this way, the surface of the copper metal layer was copper-plated by electrolytic plating and resultantly the metal layer was formed with the overall thickness of 10 $\mu$m.

Examples 2 to 7, Comparative Examples 4, 6

Using the base resin shown in Table 1, the rubber-like elastic material shown in Table 1 was mixed by the ratio shown in Table 1 to 100 parts in mass of the base resin. By kneading these in the same manner as Example 1, the resin composition was prepared. From this resin composition, the resin molded component was formed in the same manner as Example 1 and the metal layer was further formed on the surface of the resin molded component.

Example 8

Using the base resin shown in Table 1, the rubber-like elastic material shown in Table 1 was mixed by the ratio shown in Table 1 to 100 parts in mass of the base resin, and further, for the crystal nucleus agent, talc, which is a plate-form inorganic filler, was mixed so that the talc contains 0.7% in mass to the whole resin composition. By kneading these in the same manner as Example 1, the resin composition was prepared. From this resin composition, the resin molded component was formed in the same manner as Example 1 and the metal layer was further formed on the surface of the resin molded component.

Comparative Examples 1 to 3, 5

Without mixing a rubber-like elastic material, using only the base resin shown in Table 1, the resin molded component was formed in the same manner as Example 1, and on the surface of the resin molded component, the metal layer was formed.

For the resin molded components of Examples 1 to 8 and Comparative Examples 1 to 6, the peel strength of the metal layers were measured by the 90° peel test. For the resin molded components of Examples 1, 5, 6 and Comparative Example 1, the linear expansion coefficient was measured in the resin flow direction (MD) of the resin molded component. Table 1 shows the results.

As shown in Table 1, it has been confirmed that the resin molded component of Examples containing a rubber-like elastic material provides high metal layer adhesion (90° peel strength). In particular, when rubber-like elastic materials of A, B, C were used, the effects of adhesion improved by 15 to 30% were obtained. In addition, by mixing 0.5 to 10 parts in mass of the rubber-like elastic material with 100 parts in mass of the base resin, the adhesion was able to improve by 7 to 15% and at the same time, the increase of the linear expansion coefficient was able to suppress within the range of 2 to 25%. When the base resin is polyester-based resin, the improvement in metal layer adhesion is smaller even if the rubber-like elastic material is allowed to be contained.

[Inorganic Filler]

a: Glass fiber (11 $\mu$m in diameter, 1 mm in length)
b: Fibrous aluminum borate (0.5 to 1.0 $\mu$m in diameter, 10 to 30 $\mu$m in length)
c: Spherical glass (10 $\mu$m in diameter)
d: Plate-form talc (2.8 $\mu$m in length, L/D: 15 to 20)
e: Spherical silica (2 $\mu$m in diameter)

Example 9

Using the above-described PPA as the base resin, 3 parts in mass of the above-described A as the rubber-like elastic material were mixed with 100 parts in mass of the base resin and at the same time, the above described "a" was mixed as an inorganic filler in such a manner that it contains 40% in mass with respect to the overall resin composition. This was kneaded in the same manner as Example 1 to prepare the resin composition. From this resin composition, the resin molded component was formed in the same manner as Example 1, and on the surface of the resin molded component, a metal layer was formed.

Examples 10 to 16

Using the base resin shown in Table 2, the rubber-like elastic material shown in Table 2 was mixed by the ratio shown in Table 2 with 100 parts in mass of the base resin, respectively, and in addition, the inorganic fillers shown in Table 2 were mixed to achieve the contents shown in Table 2 with respect to the overall resin composition. By kneading these in the same manner as Example 1, the resin composition was prepared. From this resin composition, the resin molded component was formed in the same manner as Example 1 and the metal layer was further formed on the surface of the resin molded component.

Comparative Examples 7, 8

Without mixing the rubber-like elastic material, using the base resin shown in Table 2, the inorganic fillers shown in Table 2 were mixed with the base resin to achieve the contents shown in Table 2 with respect to the overall resin composition. By kneading these in the same manner as Example 1, the resin composition was prepared. From this resin composition, the resin molded component was formed in the same manner as Example 1 and the metal layer was further formed on the surface of the resin molded component.

For the resin molded components of Examples 9 to 16 and Comparative Examples 7, 8, the peel strength of the metal layer was measured by the 90° peel test. In addition, for the resin molded components of Examples 9 to 14, the linear expansion coefficient was measured in the resin flow direction (MD) of the resin molded component, in the transverse direction (TD), and in the direction perpendicular to it (Z), and for the resin molded components of Example 1 and Examples 15, 16, and Comparative Examples 7, 8, the linear expansion coefficient was measured in the resin flow direction (MD) and in the transverse direction to it (TD) when the resin molded component was injection-molded. Table 3 shows the results.

As shown in Table 3, it has been confirmed that the resin molded component of Examples containing a rubber-like elastic material provides a higher metal layer adhesion (90° peel strength) and the linear expansion coefficient decreases in accordance with the mixing of the inorganic filler. By using a fibrous inorganic filler of 0.5 to 5 μm in diameter and 10 to 50 μm in length, not only the linear expansion coefficient was able to reduce, but also the anisotropy was able to relax. When the plate-form inorganic filler was used, the anisotropy of the linear expansion coefficient in the flow direction and in the transverse direction to it was able to eliminate. Furthermore, when a fibrous inorganic filler of 0.5 to 5 μm in diameter and 10 to 50 μm in length and a plate-form inorganic filler were used together, the anisotropy of the linear expansion coefficient in the flow direction and in the transverse direction to it was able to further reduce, compared to the case using only fibrous inorganic filler, and at the same time, the linear expansion coefficient in the thickness direction was able to reduce. When the spherical inorganic filler was used, the linear expansion coefficients in all the directions were able to become almost uniform.

The resin molded component according to the first embodiment in the present invention is a resin molded component on the surface of which is covered with metal by a physical deposition method chosen from sputtering, vacuum evaporation, and ion plating after the surface is activated by plasma treatment and is formed by molding the resin composition mixed a rubber-like elastic material with the base resin comprising of a thermoplastic resin or a thermosetting resin. Thus, the adhesion of the metal layer formed by the physical deposition method can be improved by chemically activating through plasma-treating the surface of the resin molded component and at the same time, the elastic modulus of the resin molded component is lowered and the flexibility is enhanced to improve the energy absorption, and even when the external force of exfoliating the metal layer such as thermal stress due to the difference of linear expansion coefficient between the surface of the resin molded component and the metal layer provided on the surface is exerted, the external force can be relaxed and the adhesion of the metal layer can be improved. In addition, it is possible to improve the impact resistance by containing the rubber-like elastic material in the resin molded component, and it is also possible to reduce the chipping and the cracking in the resin molded component, or the peel-off of mold burr. Consequently, for example, when the resin molded component is applied to a printed circuit board, the resin molded component is free of generation and contamination of foreign matters arising from these, and thus, the bump bondability can be stabilized.

The resin molded component according to the second embodiment is easier to be activated by plasma treatment and can achieve a higher adhesion of the metal layer to the resin molded component, in addition to the effects of the invention of the first embodiment, since for the resin molded component, at least one kind of copolymer chosen from ethylene-glycidyl methacrylate-methyl acrylate copolymer, ethylene-maleic anhydride-ethyl acrylate copolymer, graft copolymer of ethylene-glycidyl methacrylate copolymer and acrylonitrile-styrene copolymer, and ethylene-glycidyl methacrylate-ethylene ethyl acrylate copolymer is used.

The resin molded component according to the third embodiment can improve the adhesion between the metal and the resin molded component surface more greatly without increasing the linear expansion coefficient of the formed resin molded component, in addition to the effects of the invention of the second embodiment, since a mixing amount of the rubber-like elastic material is between 0.5 and 10 parts in mass with respect to 100 parts in mass of the base resin.

The resin molded component according to the fourth embodiment provides excellent adhesion of the original metal layer and improved adhesion effects of the metal layer by the rubber-like elastic material, and further provides excellent heat resistance, mechanical properties, and chemical resistance, in addition to the effects of the invention of the first embodiment, since polyphthalamide or polyphenylene sulfide is used as the base resin.

The resin molded component according to the fifth embodiment can improve, in addition to the effects of the invention of the first embodiment, the dimensional stability of the resin molded component and suppress the generation of thermal deformation and the like, while securing the adhesion since the resin composition with an inorganic filler mixed is used as a resin composition.

The resin molded component according to the sixth embodiment, in addition to the effects of the invention of the fifth embodiment, depending on the inorganic filler being fibrous of 0.5 to 5 μm in diameter and 10 to 50 μm in length, can reduce the generation of molding warpage and thermal deformation since the anisotropy of physical properties caused by orientation by the flow of resin at the time of forming is relaxed and the difference of linear expansion coefficient and the molding shrinkage ratio between in the flow direction of resin composition and in the transverse direction is reduced, and the flatness at the time of molding (initial flatness) is excellent and thus, the change in flatness by heating can be reduced. Furthermore, it is possible to prevent the circuit conductive reliability from lowering by the circuit adhesion lowered as the resin molded component is thermally deformed.

The resin molded component according to the seventh embodiment can reduce the inorganic filler content depending on the inorganic filler being plate-form, in addition to the effects of the invention of the fifth embodiment, and can relax the anisotropy of physical properties caused by orientation by the flow of resin at the time of forming and the difference of the linear expansion coefficient and the molding shrinkage ratio between in the flow direction of resin composition and in the transverse direction to it further decreases and thus, the linear expansion coefficient also decreases. Since the generation of molding warpage and the thermal deformation can be reduced, the excellent flatness at the time of forming (initial flatness) is secured and at the same time, the change in flatness by heating can be reduced and the thermal deformation amount in-plane direction also can be reduced. Furthermore, it is possible to prevent the circuit conductive reliability from lowering by the circuit adhesion lowered as the resin molded component is thermally deformed.

The resin molded component according to the eighth embodiment can, in addition to the effects of the invention of the fifth embodiment, relax the anisotropy of physical properties caused by orientation in the flow direction of resin composition, in the transverse direction, and in the direction perpendicular to it (thickness direction) by the flow of resin at the time of forming, excellent initial flatness is achieved, since an inorganic fibrous filler of 0.5 to 5 μm in diameter and 10 to 50 μm in length and the plate-form inorganic filler are used together, and thus, the molding shrinkage ratio and the linear expansion coefficient can be kept small and the anisotropy can be suppressed to a small level irrespective of the flow direction of the resin composition, and consequently, it is not only possible to achieve excellent flatness at the time of molding (initial flatness) in all the surfaces and to reduce the change in the flatness being heating, but also possible to reduce the thermal deformation rate in the in-plane direction. Furthermore, it is possible to prevent the circuit conductive reliability from lowering by the circuit adhesion lowered as the resin molded component is thermally deformed.

The resin molded component according to the ninth embodiment, in addition to the effects of the invention of the fifth embodiment, does not cause the filler to orient due to the flow of resin at the time of molding since the inorganic filler is spherical, and can achieve almost an equal linear expansion coefficient and the molding shrinkage ratio among in the flow direction of the resin composition of the resin molded component, in the transverse direction and in the direction perpendicular to it (thickness direction), and thus can provide excellent initial flatness, and at the same time, can prevent the deformation by heat, and the changes of the flatness by heating are small, and the spherical filler causes less surface irregularities even if the filler is exposed to the surface, and the surface can be smoothly formed. Furthermore, it is possible to prevent the circuit conductive reliability from lowering by the circuit adhesion lowered as the resin molded component is thermally deformed.

The resin molded component according to the tenth embodiment, in addition to the effects of the invention of the fifth embodiment, can improve the dimensional stability of the resin molded component while securing the adhesion of the metal layer to the resin molded component since a mixing amount of the inorganic filler is from 40 to 75% in mass with respect to the whole resin constituents.

The invention according to the eleventh embodiment intends to use the resin molded component according to the first embodiment as a printed circuit board, and since the adhesion of the metal layer to the resin molded component is high as described above and the adhesion of the circuit formed by the metal layer can be improved, excellent electrical characteristics such as conductive reliability and the like, can be obtained. In particular, even if the circuit board is exposed to a high temperature atmosphere such as in reflow and the like, at the time of mounting parts, not only the adhesion of the circuit formed by the metal layer can be maintained, but also the resin molded component provides excellent flatness and can suppress the thermal deformation, and, thus the excellent effects as the printed circuit board can be obtained.

TABLE 1

| | Base resin | | Rubber-like elastic material | | Rating | |
|---|---|---|---|---|---|---|
| | Kind | Mixing amount (parts in mass) | Kind | Mixing amount (parts in mass) | 90° peel strength (N/mm) | Linear expansion coefficient ($\times 10^{-6}/°$ C.) |
| Example 1 | PPA | 100 | A | 3 | 0.86 | 130 |
| Example 2 | PPA | 100 | B | 3 | 0.86 | — |
| Example 3 | PPA | 100 | C | 3 | 0.80 | — |
| Example 4 | PPA | 100 | D | 3 | 0.75 | — |
| Example 5 | PPA | 100 | A | 0.5 | 0.80 | 123 |
| Example 6 | PPA | 100 | A | 10 | 0.86 | 150 |
| Example 7 | PPS | 100 | C | 3 | 1.1 | — |
| Example 8 | PPA | 100 | B | 3 | 0.86 | — |
| Comparative Example 1 | PPA | 100 | — | — | 0.72 | 120 |
| Comparative Example 2 | PPS | 100 | — | — | 0.60 | — |
| Comparative Example 3 | PET | 100 | — | — | 0.40 | — |
| Comparative Example 4 | PET | 100 | A | 3 | 0.44 | — |
| Comparative Example 5 | PBT | 100 | — | — | 0.41 | — |
| Comparative Example 6 | PBT | 100 | A | 3 | 0.43 | — |

TABLE 2

| | Base resin | | Rubber-like elastic material | | Inorganic filler | |
|---|---|---|---|---|---|---|
| | Kind | Mixing amount (parts in mass) | Kind | Mixing amount (parts in mass) | Kind | Mixing amount (parts in mass) |
| Example 1 | PPA | 100 | A | 3 | — | — |
| Example 9 | PPA | 100 | A | 3 | a | 40 |
| Example 10 | PPA | 100 | A | 3 | b | 40 |
| Example 11 | PPA | 100 | A | 3 | c | 40 |
| Example 12 | PPA | 100 | A | 3 | d | 40 |
| Example 13 | PPA | 100 | A | 3 | b/d | 20/20 |
| Example 14 | PPA | 100 | A | 3 | b/d | 30/20 |
| Example 15 | PPS | 100 | A | 3 | e | 40 |
| Example 16 | PPS | 100 | A | 5 | e | 75 |
| Comparative Example 7 | PPS | 100 | — | 5 | e | 40 |
| Comparative Example 8 | PPS | 100 | — | — | e | 75 |

TABLE 3

| | Rating | | | |
|---|---|---|---|---|
| | 90° peel strength (N/mm) | Linear expansion coefficient ($\times 10^{-6}/°$ C.) | | |
| | | MD | TD | Z |
| Example 1 | 0.86 | 120 | 130 | — |
| Example 9 | 0.80 | 10 | 37 | 60 |
| Example 10 | 0.78 | 13 | 25 | 45 |
| Example 11 | 0.77 | 41 | 42 | 44 |
| Example 12 | 0.75 | 23 | 23 | 60 |
| Example 13 | 0.75 | 14 | 20 | 48 |
| Example 14 | 0.70 | 13 | 16 | 40 |
| Example 15 | 1.1 | 35 | 37 | — |
| Example 16 | 0.80 | 22 | 23 | — |
| Comparative Example 7 | 0.60 | 30 | 31 | — |
| Comparative Example 8 | 0.35 | 19 | 19 | — |

What is claimed is:

1. A resin molded component, comprising a metal coating provided on the surface thereof by a physical deposition method selected from at least one method consisting of sputtering, vacuum deposition, and ion plating, after the surface is activated by a plasma treatment,
wherein the resin molded component comprises a resin composition comprising a base resin comprising at least one member selected from the group consisting of polyphthalamide and polyphenylene sulfide, and an elastic material, wherein the elastic material comprises at least one copolymer selected from the group consisting of ethylene-glycidyl methacrylate-methyl acrylate copolymer, ethylene-maleic anhydride-ethyl acrylate copolymer, graft copolymer of ethylene-glycidyl methacrylate copolymer and acrylonitrile-styrene copolymer, and ethylene-glycidyl methacrylate-ethylene ethyl acrylate copolymer.

2. The resin molded component according to claim 1, wherein the elastic material is present in an amount of from 0.5 to 10 parts in mass to 100 parts in mass of said base resin.

3. The resin molded component according to claim 1, wherein said resin composition further comprises an inorganic filler.

4. The resin molded component according to claim 3, wherein said inorganic filler is fibrous having a diameter of from 0.5 to 5 μm and a length of from 10 to 50 μm.

5. The resin molded component according to claim 3, wherein said inorganic filler is plate-form.

6. The resin molded component according to claim 3, wherein said inorganic filler is a combination of a fiber form having a diameter of from 0.5 to 5 μm and a length of from 10 to 50 μm with a plate-form inorganic filler.

7. The resin molded component according to claim 3, wherein said inorganic filler is spherical.

8. The resin molded component according to claim 3, wherein said inorganic filler is present in an amount of from 40 to 75% in mass with respect to said whole resin composition.

9. The resin molded component according to claim 1, wherein said resin composition further comprises a plate-form inorganic filler comprising at least one member selected from the group consisting of talc, mica, glass flake, monmorillonite, and smectite.

10. The resin molded component according to claim 1, wherein said elastic material comprises ethylene-glycidyl methacrylate-methyl acrylate copolymer.

11. The resin molded component according to claim 1, wherein said elastic material comprises ethylene-maleic anhydride-ethyl acrylate copolymer.

12. The resin molded component according to claim 1, wherein said elastic material comprises graft copolymer of ethylene-glycidyl methacrylate copolymer and acrylonitrile-styrene copolymer.

13. The resin molded component according to claim 1, wherein said elastic material comprises ethylene-glycidyl methacrylate-ethylene ethyl acrylate copolymer.

14. The resin molded component according to claim 1, wherein the base resin comprises at least a polyphthalamide.

15. The resin molded component according to claim 1, wherein the base resin comprises at least a polyphenylene sulfide.

16. The resin molded component according to claim 15, wherein the said elastic material comprises graft copolymer of ethylene-glycidyl methacrylate copolymer and acrylonitrile-styrene copolymer.

17. A printed circuit board, comprising the resin molded component according to claim 1.

* * * * *